(12) United States Patent
Lin

(10) Patent No.: US 12,733,193 B2
(45) Date of Patent: Sep. 8, 2026

(54) SEMICONDUCTOR STRUCTURE COMPRISING FIRST III-V COMPOUND LAYERAND SECOND III-V COMPOUND LAYER AND METHOD OF MANUFACTURE

(71) Applicant: Taiwan Semiconductor Manufacturing Company Limited, Hsin-Chu (TW)

(72) Inventor: En-Shuo Lin, New Taipei City (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 755 days.

(21) Appl. No.: 17/849,980

(22) Filed: Jun. 27, 2022

(65) Prior Publication Data

US 2023/0420553 A1 Dec. 28, 2023

(51) Int. Cl.

| | |
|---|---|
| ***H10D 30/47*** | (2025.01) |
| ***H01P 3/00*** | (2006.01) |
| ***H01P 11/00*** | (2006.01) |
| ***H10D 30/01*** | (2025.01) |
| ***H10D 62/824*** | (2025.01) |
| ***H10D 62/85*** | (2025.01) |
| ***H10P 14/20*** | (2026.01) |
| ***H10P 14/24*** | (2026.01) |
| ***H10W 44/20*** | (2026.01) |

(52) U.S. Cl.

CPC ........... *H10D 30/475* (2025.01); *H01P 3/003* (2013.01); *H01P 11/003* (2013.01); *H10D 30/015* (2025.01); *H10D 62/824* (2025.01); *H10D 62/8503* (2025.01); *H10P 14/24* (2026.01); *H10P 14/2905* (2026.01); *H10P 14/3216* (2026.01); *H10P 14/3416* (2026.01); *H10P 14/3418* (2026.01); *H10P 14/3421* (2026.01); *H10W 44/20* (2026.01); *H10W 44/216* (2026.01)

(58) Field of Classification Search

CPC ............. H10D 30/475; H10D 62/8503; H10D 30/015; H10D 62/824; H10W 44/20; H10W 44/216; H10P 14/24; H10P 14/2905; H10P 14/3421; H10P 14/3216; H10P 14/3418; H10P 14/3416; H01P 3/003; H01P 11/003

USPC .......................................................... 257/223

See application file for complete search history.

(56) References Cited

U.S. PATENT DOCUMENTS 8,994,114 B1 * 3/2015 Leckey ............. H10D 62/8503 438/142
2005/0110043 A1 * 5/2005 Otsuka ................ H10D 30/015 257/E29.317

(Continued)

*Primary Examiner* — Norman D Richards
*Assistant Examiner* — Colin Russell Mccutcheon
(74) *Attorney, Agent, or Firm* — Cooper Legal Group, LLC

(57) ABSTRACT

A semiconductor structure includes a substrate including a p-type region and an n-type region, wherein the n-type region is in the p-type region and a distance between a top surface of the substrate and the n-type region is less than a distance between the top surface of the substrate and the p-type region. A buffer layer is over the n-type region and a first III-V compound layer is over the buffer layer. A second III-V compound layer is over the first III-V compound layer and a metal structure is over the second III-V compound layer. The metal structure may include a coplanar waveguide or a high electron mobility transistor.

20 Claims, 11 Drawing Sheets

(56) References Cited

U.S. PATENT DOCUMENTS

| | | | | |
|---|---|---|---|---|
| 2006/0231860 | A1* | 10/2006 | Mishra | H10D 62/221<br>257/E29.05 |
| 2012/0098036 | A1* | 4/2012 | Bahl | H10D 30/015<br>257/E21.403 |
| 2014/0361371 | A1* | 12/2014 | Comeau | H01L 21/76229<br>257/351 |
| 2019/0280613 | A1* | 9/2019 | Fujii | H10D 8/00 |
| 2022/0375811 | A1* | 11/2022 | Baburske | H10D 62/145 |
| 2022/0376084 | A1* | 11/2022 | Hao | H10D 62/115 |

* cited by examiner

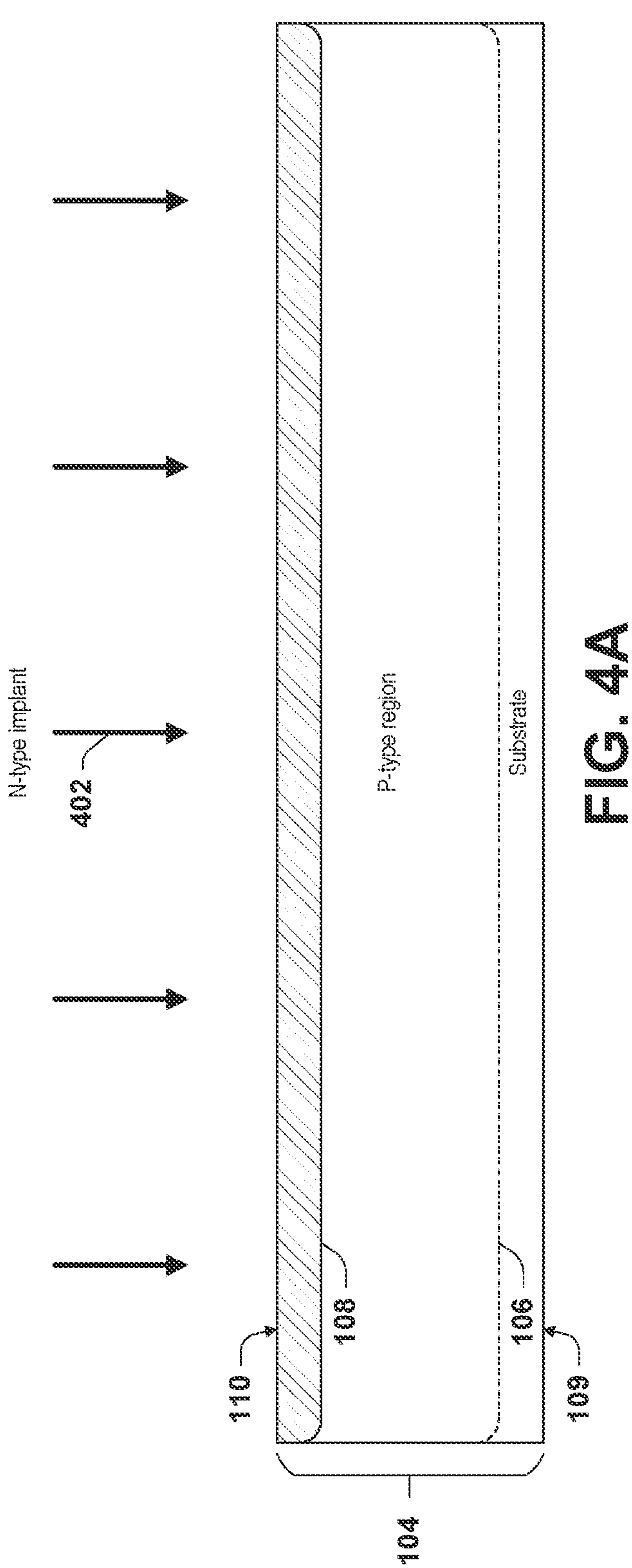
N-type implant
402
P-type region
Substrate
110
108
106
109
104
FIG. 4A
100

SEMICONDUCTOR STRUCTURE COMPRISING FIRST III-V COMPOUND LAYERAND SECOND III-V COMPOUND LAYER AND METHOD OF MANUFACTURE

BACKGROUND

Semiconductor devices are used in a multitude of electronic devices, such as mobile phones, laptops, desktops, tablets, watches, gaming systems, and various other industrial, commercial, and consumer electronics. Semiconductor devices may be formed on a semiconductor substrate and may interact with components and/or layers of the semiconductor substrate to form various integrated circuit devices, such as high power field-effect transistors, high-frequency transistors, high electron mobility transistors (HEMTs), etc. A HEMT is a field effect transistor incorporating a junction between two materials with different band gaps (i.e., a heterojunction) as the channel instead of a doped region, as generally found in metal oxide semiconductor field effect transistors (MOSFETs). HEMTs, like other field effect transistors (FETs), are used in integrated circuits as digital switches and as amplifiers for controlling large currents using a small voltage control signal. HEMTs generally have the ability to operate at higher frequencies than MOSFETs, such as microwave frequencies, and are incorporated into high-frequency electronic devices such as cell phones, satellite television receivers, voltage converters, etc. When used in high-frequency applications, HEMTs may communicate signals through waveguide transmission lines, such as coplanar waveguides.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4F illustrate a semiconductor structure at various stages of fabrication, according to some embodiments.

DETAILED DESCRIPTION

Figure 1A:
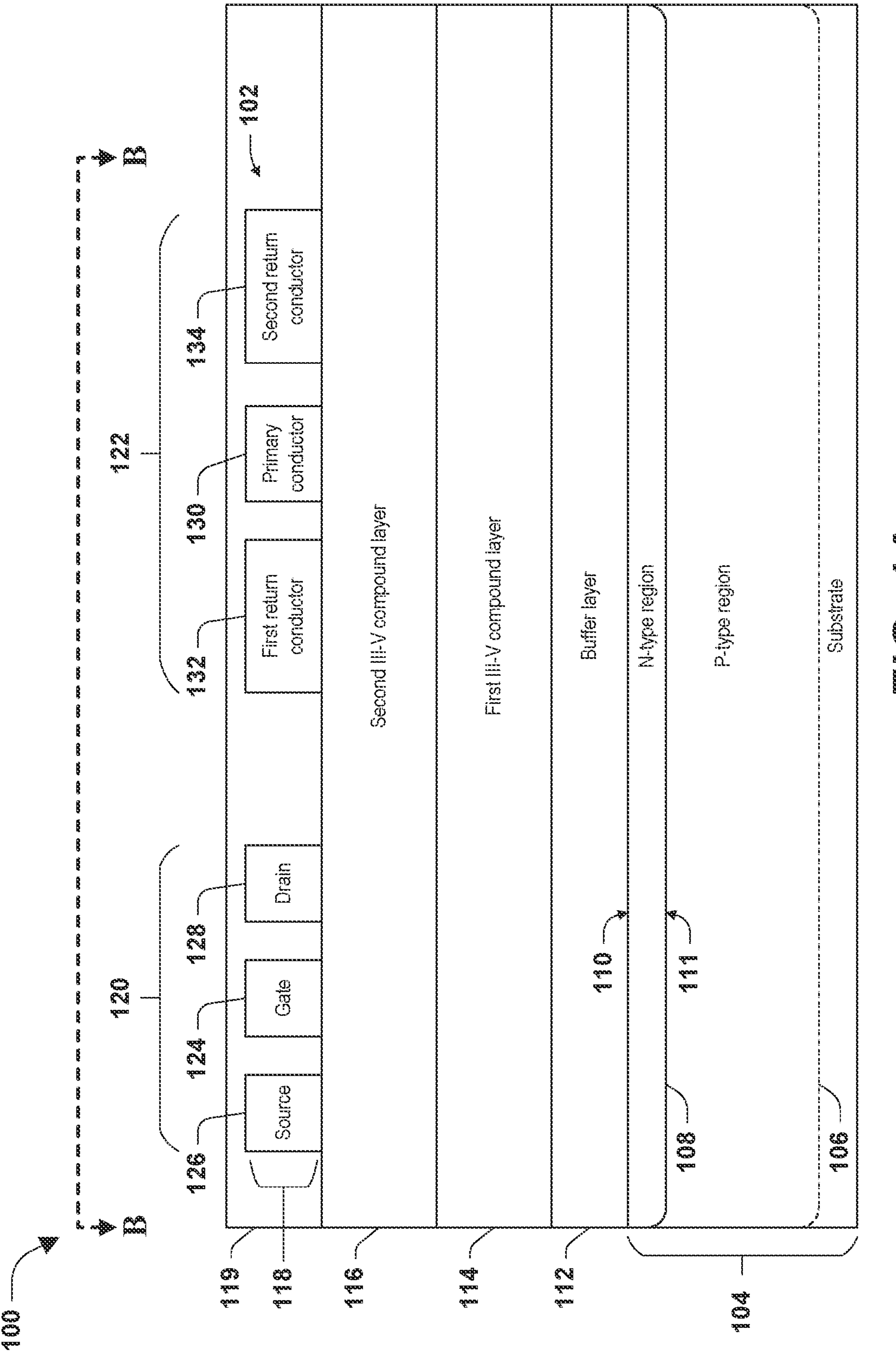
FIGS. 1A-1B illustrate a semiconductor structure including a metal structure, according to some embodiments.

The following disclosure provides several different embodiments, or examples, for implementing different features of the provided subject matter with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures. Source/drain region(s) may refer to a source or a drain, individually, or collectively dependent upon the context.

Structures, devices, and/or methods for lowering transmission loss in metal structures, such as HEMTs and/or coplanar waveguides over a substrate, such as a silicon substrate, are provided. Such transmission losses may include RF transmission losses. According to some embodiments, a metal structure, such as a HEMT, is formed over a first III-V compound layer, such as AlGaN, a second III-V compound layer, such as GaN, and a buffer layer, such as AlN. The HEMT may include a junction between two or more underlying material layers with different band gaps to form a channel between a source and a drain of the HEMT. The different band gaps provide a heterojunction as the channel, instead of a doped region of a substrate as generally provided in MOSFETs. The channel underlies the HEMT and is formed in underlying layers, such as the second III-V compound layer, as a two dimensional electron gas (2DEG), which may be alternately referred to as a first 2DEG or a primary 2DEG. Because the HEMT may operate at high frequencies, such as microwave frequencies, parasitic losses may be formed through interaction with other underlying layers, other components, and/or the substrate. Such parasitic losses may impact RF device performance.

In some embodiments, the buffer layer may include AlN, which may be formed through epitaxial growth, such as metal-organic chemical vapor deposition (MOCVD) growth, over the substrate. The buffer layer may alternatively be referred to as a nuclear layer for GaN HEMT. During AlN growth, the AlN layer to Si substrate interface (e.g., a p-type Si substrate interface), may suffer Al back diffusion into the Si substrate, and cause an electron inversion layer in heterojunction at the interface. Because AlN is a piezoelectric material, a large tensile stress may be induced by a mismatch between the AlN layer and Si substrate, resulting in a strong polarization field. The tensile stress, through piezoelectric action, may cause the formation of a potential well, which confines carriers to a region close to the interface to form a second 2DEG, which may be alternately referred to as a secondary 2DEG. To mitigate and/or reduce formation of the secondary 2DEG, an n-type region or layer, alternately referred to as an n-type barrier layer, is formed on a p-type region of the Si substrate surface. Such n-type region mitigates and/or reduces formation of the secondary 2DEG through minimization and/or elimination of Al diffusion into the p-type region and/or minimization and/or elimination of the electron inversion layer at the interface of the AlN layer and the Si substrate. During operation of the HEMT, coupling of the primary 2DEG induced in the GaN channel by a microwave signal to such secondary 2DEG may be reduced and current gain through the HEMT may be improved due to lower transmission loss. During operation of the HEMT, coupling of a current induced in a conductor of a coplanar waveguide to such secondary 2DEG may be reduced and current gain through the HEMT may be improved due to lower transmission loss.

Figure 1B:
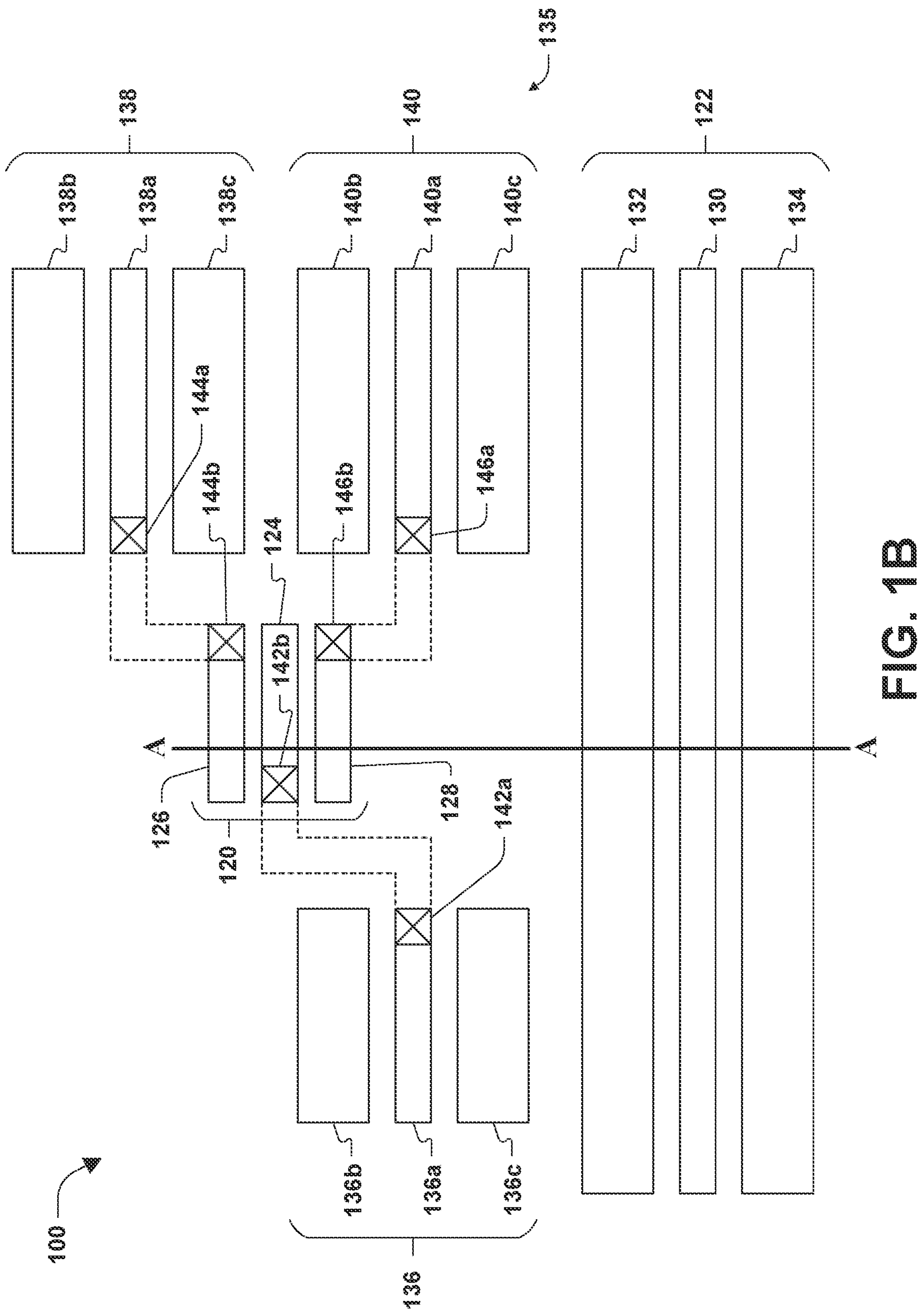

FIGS. 1A-1B illustrate a semiconductor structure 100 including a metal structure 102, according to some embodiments. FIG. 1A is a cross-sectional view of the semiconductor structure 100 and FIG. 1B is a top-down view of the semiconductor structure 100. According to some embodiments, the semiconductor structure 100 comprises a substrate 104, which includes a p-type region 106 and an n-type region 108. In some embodiments, the n-type region 108 is implanted into a top surface 110 of the substrate 104 in the p-type region 106, where an interface 111 is provided between the n-type region 108 and the p-type region 106. In some embodiments, the p-type region 106 is a blanket implant into the substrate 104 and the n-type region 108 is a blanket implant into the p-type region 106. In some embodiments, the n-type region 108 is implanted into an upper region, such as near the top surface 110, of the substrate 104 in the p-type region 106. The p-type region 106 generally extends into the substrate 104 to a greater depth than the n-type region 108 such that a distance between the top surface 110 of the substrate 104 and the n-type region 108 is less than a distance between the top surface 110 of the substrate 104 and the p-type region 106. The semiconductor structure 100 comprises a buffer layer 112 over the n-type region 108 and a first III-V compound layer 114 over the buffer layer 112. The semiconductor structure 100 comprises a second III-V compound layer 116 over the first III-V compound layer 114 and a metal layer 118 over the second III-V compound layer 116. The semiconductor structure 100 comprises a dielectric layer 119 over the metal layer 118. In some embodiments, the metal layer 118 is patterned to form one or more metal structures, such as the metal structure 102 over the second III-V compound layer 116. For example, the metal structure 102 may include one or more transistors, such as a HEMT 120 (high electron mobility transistor), or one or more waveguides, such as a coplanar waveguide 122. In some embodiments, the HEMT 120 includes a gate 124, a source 126, and a drain 128. Source/drain region(s), such as the source 126 and/or the drain 128 may refer to a source or a drain, individually or collectively dependent upon the context. In some embodiments, the coplanar waveguide 122 includes a primary conductor 130, a first return conductor 132, and a second return conductor 134.

According to some embodiments, the substrate 104 comprises at least one of an epitaxial layer, a silicon-on-insulator (SOI) structure, a wafer, or a die formed from a wafer. For example, the epitaxial layer may comprise a deposition of an overlayer on a crystalline substrate, where the overlayer is in registry with the substrate 104. In some embodiments, SOI substrates are fabricated using separation by implantation of oxygen (SIMOX), wafer bonding, and/or other suitable methods. In some embodiments, the substrate 104 includes an insulator layer (not shown). The insulator layer may be comprised of any suitable material, including silicon oxide, sapphire, other suitable insulating materials, and/or combinations thereof. An exemplary insulator layer may be a buried oxide layer (BOX). The insulator may be formed by any suitable process, such as implantation (e.g., SIMOX), oxidation, deposition, and/or other suitable process. In some embodiments, the epitaxial layer may comprise a type of crystal growth or material deposition in which new crystalline layers are formed with one or more well-defined orientations with respect to a crystalline seed layer of the substrate 104. In some embodiments, the substrate 104 comprises at least one of a silicon carbide (SiC) substrate, a sapphire substrate, a bulk silicon substrate, or a crystal silicon substrate. In some embodiments, the substrate 104 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, other suitable material, or combinations thereof. In some embodiments, the substrate 104 may be comprised of an elementary semiconductor in a crystalline structure, a compound semiconductor in a crystalline structure, or other mixtures in a crystalline structure.

Crystal orientation may be described by a basic unit cell, i.e., a triclinic system, using six independent lattice parameters (three lengths and three angles). For a cubic system, such as a silicon substrate, the unit cell length is the same in all three directions and all angles are 90°. In this direct space, any point within the crystal having all integer coordinates corresponds to a corner lattice point, i.e., vertex, of a unit cell. Crystal orientation may be generally specified by Miller indices, (h,k,l), which correspond to three direct space coordinate axis intercepts. Three points uniquely determine a geometric plane, and three axis intercepts define a crystallographic plane. A plane that intersects each axis at a distance of one lattice parameter from the origin, i.e., the plane has unit intercepts on each coordinate axis, may be identified as the <111> crystallographic plane. A plane that is parallel to the y and z axes, but has unit intercept on the x axis, may designate the Miller indices, h, k, and l as reciprocals of the x, y, and z axis intercepts instead of the intercepts themselves, and may be identified as the <100> crystallographic plane. A plane that is parallel to the z axis, but has unit intercepts on the x and y axes is designated as <110>. Miller indices, <100>, <010>, and <001> denote different families of crystallographic planes with all of planes corresponding to a face of the unit cell. As a consequence of the high degree of symmetry characteristic of the diamond cubic structure, all of planes <100>, <010>, and <001> are electrically and structurally equivalent. Any crystallographic plane corresponding to a face of the unit cell may be generically called a "<100>" plane. Any crystallographic plane that "cuts" a unit cell face diagonally and is also parallel to an edge of the unit cell is called a "<110>" plane. Any crystallographic plane that intersects three non-adjacent vertices of the unit cell is called a "<111>" plane. In each unit cell, there are three different, i.e., non-parallel, <100> planes, six different <110> planes, and four different <111> planes.

A silicon crystal substrate, which has a surface parallel to the unit cell face, is designated <100>. Similarly, if the surface can be thought of as intersecting three opposite corners of the unit cell, then the crystal is designated <111>. Silicon crystal <100>, alternately referred to as Si(100) may be used for fabrication of CMOS devices, while silicon crystal <111>, alternately referred to as Si(111), may be used for fabrication of bipolar devices where a shallow doping is desirable. In some embodiments, CMOS devices and/or bipolar devices may alternately be formed with silicon crystal <100> and/or silicon crystal <111>. In some embodiments, the substrate 104 may include silicon crystal <100> and/or silicon crystal <111> regions. The atomic arrangement for each crystal surface, i.e., <100>, <111>, and <110>, is different, and each may relate to a density of dangling bonds that are left behind if a crystal breaks or "cleaves" parallel to a particular crystallographic plane. This density is directly related to the surface energy of a crystal of a particular orientation. In the diamond cubic structure, for a <100> plane, four bonds per unit cell must be broken in order to cleave the crystal. For cleavage parallel to a <111> plane, only three bonds per unit cell must be broken. A Si(100) substrate structure naturally separates into quarters and a Si(111) substrate structure naturally separates into sixths. In some embodiments, the substrate 104 includes an Si(111) substrate structure that may be more susceptible to damage from ion implantation to create the p-type region 106 and the n-type region 108 than an Si(100) substrate structure. In some embodiments, the p-type region 106 of the substrate 104 comprises a Si(111) structure having a resistivity less than 100 Ohm-cm, and a concentration of Al in the n-type region 108 less than 1.0E13 $cm^{-3}$.

According to some embodiments, the substrate 104 has at least one of a first doped region, such as an n-type doped region or a p-type doped region, and a second doped region, such as a non-doped region or a different type of doped region than the first doped region. The doped regions may be formed directly on the substrate 104, in a p-well structure, in an n-well structure, in a dual-well structure, or using a raised structure. In some embodiments, the substrate 104 may further include various active regions, such as regions configured for n-type MOSFET devices and regions configured for p-type MOSFET devices.

A p-type doped region, such as the p-type region 106, may be formed by doping the substrate 104 with an electron acceptor element. In p-type semiconductors, positive charges, also known as electron holes, are the majority charge carriers and electrons are the minority charge carriers. In some embodiments, p-type semiconductors may have a larger hole concentration than electron concentration. In a p-type doped region, the Fermi level is below the intrinsic semiconductor base material and lies closer to the valence band than the conduction band. In some embodiments, a p-type dopant for p-type silicon is boron, $BF_2$, gallium, or other material that creates electron holes as majority charge carriers.

An n-type doped region, such as the n-type region 108, may be formed by doping the substrate 104 with an electron donor element. In n-type semiconductors, electrons are majority charge carriers and holes are minority charge carriers. In an n-type doped region, the Fermi level is greater than the Fermi level of the intrinsic semiconductor base material and lies closer to the conduction band than the valence band. In some embodiments, an n-type dopant for n-type silicon comprises phosphorus, arsenic, or other material that creates electrons as majority charge carriers. For example, the n-type region 108 may be formed in the p-type region 106 through ion implantation of phosphorus with an energy of 10-200 keV, such as 50 keV. The n-type region 108 may be formed with an ion dose of 1E14-1E16 ions/$cm^2$, such as 1E15-5E15 ion/$cm^2$, or 3E15 ions/$cm^2$. Other structures and/or configurations of the substrate 104 are within the scope of the present disclosure.

According to some embodiments, the buffer layer 112 is over the substrate 104. The buffer layer 112 acts as a buffer and/or a transition layer for the subsequently formed overlying layers. The buffer layer 112 may be epitaxially grown using MOCVD. The buffer layer 112 may function as an interface to reduce lattice mismatch between substrate 104 and the first III-V compound layer 114. Such lattice mismatch may occur due to damage to the Si(111) crystalline structure of the substrate 104 during formation of the p-type region 106 and/or the n-type region 108. In some embodiments, the buffer layer 112 includes an aluminum nitride (AlN) layer having a thickness in a range between about 10 nanometers (nm) and about 300 nm. In some embodiments, the AlN layer comprises a hexagonal wurtzite crystal structure, a metastable cubic zincblende phase, such as in the form of a thin film, or another type of structure. The buffer layer 112 may include a single layer or a plurality of layers. In the case of multiple layers, the buffer layer 112 may include a low-temperature AlN layer (not shown) formed at a temperature between about 800 degrees Celsius (° C.) and about 1,200° C., and a high-temperature AlN layer (not shown) formed at a temperature between about 1,000° C. and about 1,400° C. In some embodiments, a second buffer layer is between the buffer layer 112 and the n-type region 108, wherein the buffer layer 112 comprises AlN, and the second buffer layer comprises SiN to limit diffusion of Al into the n-type region 108 during formation of the buffer layer 112. Other structures and/or configurations of the buffer layer 112 are within the scope of the present disclosure.

According to some embodiments, the first III-V compound layer 114 is over the buffer layer 112. The first III-V compound layer 114 may include a single layer or a plurality of layers. The first III-V compound layer 114 is a compound made from the III-V groups in the periodic table of elements. Group Ill binary elements include B, Al, Ga, In, or TI. Group V binary elements include N, P, As, Sb, or Bi. In some embodiments, the first III-V compound layer 114 includes at least one of BN, AlN, GaN, InN, TlN, BP, AlP, GaP, InP, TlP, Bas, AlAs, GaAs, InAs, TlAs, BSb, AlSb, GaSb, InSb, TlSb, BBi, AlBi, GaBi, InBi, or TlBi. In some embodiments, the first III-V compound layer 114 includes at least one of aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium indium arsenide antimonide phosphide, gallium phosphide, indium antimonide, indium arsenide, indium arsenide antimonide phosphide, indium gallium arsenide, indium gallium nitride, indium gallium phosphide, indium nitride, indium phosphide, graphene, or nanomesh. In some embodiments, the first III-V compound layer 114 includes a III-V compound alone or in combination with another material. Other compositions and/or configurations of the first III-V compound layer 114 are within the scope of the present disclosure.

In some embodiments, the first III-V compound layer 114 includes an aluminum gallium nitride (AlGaN) layer. In some embodiments, aluminum gallium nitride comprises any alloy of aluminum nitride and gallium nitride. In some embodiments, aluminum gallium nitride may be represented as $Al_xGa_{1-x}N$. In some embodiments, the bandgap of $Al_xGa_{1-x}N$ is between about 3.4 eV (x=0) to 6.2 eV (x=1). In some embodiments, the first III-V compound layer 114 includes an aluminum gallium arsenide (AlGaAs) layer. In some embodiments, aluminum gallium arsenide comprises any alloy of aluminum arsenide and gallium arsenide. In some embodiments, aluminum gallium arsenide may be represented as $Al_xGa_{1-x}As$. In some embodiments, the bandgap of $Al_xGa_{1-x}As$ is between about 1.42 eV (x=0) to 6.2 eV (x=1). In some embodiments, the first III-V compound layer 114 forms a heterojunction with the second III-V compound layer 116.

In some embodiments, the first III-V compound layer 114 comprises two layers with different percentages of Al. Alternatively, the two layers of the first III-V compound layer 114 may comprise AlGaAs or AlInP with different percentages of Al. The percentage of Al of one of the two layers of the first III-V compound layer 114 is lower than the other of the two layers of the first III-V compound layer 114. In some embodiments, a ratio of the percentage of Al the one layer of the first III-V compound layer 114 to that of the other layer of the first III-V compound layer 114 is in a range from about 1.1 to 2.5. For example, the percentage of Al of AlGaN of the one layer of the first III-V compound layer 114 may be 16% and the percentage of Al of AlGaN of the other layer of the first III-V compound layer 114 would be in a range from about 17.6% to 40%. In some embodiments, the percentage of Al of AlGaN of the one layer of the first III-V compound layer 114 is in a range from about 12% to about 18% while the percentage of Al of AlGaN of the other layer of the first III-V compound layer 114 is in a range from about 23% to about 40%. In some embodiments, the first III-V compound layer 114 may have more than two AlGaN layers, each having a different percentage of Al. In some embodiments, the percentage of Al of AlGaN layers increases as the AlGaN layer is distant from the buffer layer 112. For example, the one layer of the AlGaN layer with a higher percentage of Al may be grown on the other layer of the AlGaN layer with a lower percentage of Al, which may be grown on the buffer layer 112. Other compositions and/or configurations of the first III-V compound layer 114 are within the scope of the present disclosure.

In some embodiments, the first III-V compound layer 114 is epitaxially grown by using, for example, MOCVD, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals. In some embodiments, the first III-V compound layer 114 is undoped. In some embodiments, the first III-V compound layer 114 is unintentionally doped, such as through integration of a dopant by another stage of fabrication. In some embodiments, the first III-V compound layer 114 is lightly doped. For example, the first III-V compound layer 114 may be lightly doped with n-type dopants due to a precursor used to form the second III-V compound layer 116. In some embodiments, the first III-V compound layer 114 has a thickness in a range from about 5 nm to about 10 microns (μm). In some embodiments, the first III-V compound layer 114 has a thickness in a range from about 5 nm to about 50 nm. In some embodiments, the first III-V compound layer 114 has a thickness in a range from about 0.5 μm to about 10 μm. Other dimensions and/or configurations of the first III-V compound layer 114 are within the scope of the present disclosure.

According to some embodiments, the second III-V compound layer 116 is over the first III-V compound layer 114. The second III-V compound layer 116 may include a single layer or a plurality of layers. The second III-V compound layer 116 is a compound made from the III-V groups in the periodic table of elements. Group Ill binary elements include B, Al, Ga, In, or TI, as set forth herein. Group V binary elements include N, P, As, Sb, or Bi, as set forth herein. In some embodiments, the second III-V compound layer 116 includes at least one of BN, AlN, GaN, InN, TlN, BP, AlP, GaP, InP, TlP, Bas, AlAs, GaAs, InAs, TlAs, BSb, AlSb, GaSb, InSb, TlSb, BBi, AlBi, GaBi, InBi, or TlBi. In some embodiments, the second III-V compound layer 116 includes at least one of aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium indium arsenide antimonide phosphide, gallium phosphide, indium antimonide, indium arsenide, indium arsenide antimonide phosphide, indium gallium arsenide, indium gallium nitride, indium gallium phosphide, indium nitride, indium phosphide, graphene, or nanomesh. In some embodiments, the second III-V compound layer 116 includes a III-V compound alone or in combination with another material. Other compositions and/or configurations of the second III-V compound layer 116 are within the scope of the present disclosure.

In some embodiments, the second III-V compound layer 116 and the first III-V compound layer 114 are different from each other in composition. In some embodiments, the second III-V compound layer 116 includes a gallium nitride (GaN) layer. In some embodiments, the second III-V compound layer 116 includes a GaAs layer or InP layer. In some embodiments, the second III-V compound layer 116 may be epitaxially grown by using, for example, MOCVD, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals. In some embodiments, the second III-V compound layer 116 is undoped. In some embodiments, the second III-V compound layer 116 is unintentionally doped, such as through integration of a dopant by another stage of fabrication. In some embodiments, the second III-V compound layer 116 is lightly doped. For example, the second III-V compound layer 116 may be lightly doped with n-type dopants due to a precursor used to form the first III-V compound layer 114 or the buffer layer 112. In some embodiments, the second III-V compound layer 116 has a thickness in a range from about 0.5 μm to about 10 μm. Other dimensions and/or configurations of the second III-V compound layer 116 are within the scope of the present disclosure.

According to some embodiments, the metal layer 118 is formed on the second III-V compound layer 116. In some embodiments, the metal layer 118 includes at least one of aluminum (Al), titanium (Ti), nickel (Ni), gold (Au), copper (Cu), another metal, or a combination thereof. In some embodiments, the gate 124, the source 126, and the drain 128 of the HEMT 120 are formed in the metal layer 118 and horizontally spaced apart above a top surface of the second III-V compound layer 116. In some embodiments, the HEMT 120 comprises the gate 124 extending linearly over the second III-V compound layer 116, the source 126 extending linearly over the second III-V compound layer 116 and coplanar with the gate 124, and the drain 128 extending linearly over the second III-V compound layer 116 and coplanar with the gate 124. In some embodiments, the primary conductor 130, the first return conductor 132, and the second return conductor 134 of the coplanar waveguide 122 are formed in the metal layer 118 and horizontally spaced apart above a top surface of the second III-V compound layer 116. In some embodiments, the primary conductor 130 extends linearly over the second III-V compound layer 116, the first return conductor 132 extends linearly over the second III-V compound layer 116 and coplanar with the primary conductor 130, and the second return conductor 134 extends linearly over the second III-V compound layer 116 and coplanar with the primary conductor 130. In some embodiments a dielectric protection layer (not shown) is formed between the metal layer 118 and the second III-V compound layer 116. The dielectric protection layer is configured to protect the underlying second III-V compound layer 116 from damage during fabrication, such as a plasma process. In some embodiments, the dielectric protection layer has a thickness in a range between about 100 angstroms (Å) and about 5,000 Å.

In some embodiments, the dielectric protection layer may be a passivation layer comprising a dielectric material such as silicon oxide or silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The passivation layer may be formed through a process such as chemical vapor deposition (CVD), although any suitable process may be utilized, and in some embodiments may have a thickness between about 0.5 μm and about 5 μm. When comprising silicon nitride, the dielectric protection layer may be formed by performing a low-pressure chemical vapor deposition (LPCVD) method (without plasma) using, for example, $SiH_4$ and $NH_3$ gases. In some embodiments, the gate 124 is on the dielectric protection layer and between the source 126 and the drain 128. In some embodiments, the gate 124 includes a conductive material layer configured for voltage bias. In some embodiments, the conductive material layer includes a refractory metal or compounds thereof, e.g., titanium (Ti), titanium nitride (TiN), titanium tungsten (TiW) and tungsten (W). In some embodiments, the conductive material layer includes nickel (Ni), gold (Au) or copper (Cu). Other arrangements and/or configurations of the metal layer 118 and/or the components thereof are within the scope of the present disclosure.

According to some embodiments, the dielectric layer 119 is on the metal layer 118 and the second III-V compound layer 116. In some embodiments, the dielectric layer 119 surrounds the gate 124, the source 126, and the drain 128. In some embodiments, the dielectric layer 119 surrounds the primary conductor 130, the first return conductor 132, and the second return conductor 134. The dielectric layer 119 is configured to protect the underlying second III-V compound layer 116 from damage in a plasma fabrication process. In some examples, the dielectric layer 119 may be a passivation layer including silicon oxide, silicon nitride, gallium oxide, aluminum oxide, scandium oxide, zirconium oxide, lanthanum oxide, or hafnium oxide. Other arrangements and/or configurations of the dielectric layer 119 are within the scope of the present disclosure.

In some embodiments, the semiconductor structure 100 includes isolation regions (not shown), to isolate the HEMT 120 in the semiconductor structure 100 from other devices in the substrate 104. In some embodiments, the isolation regions include doped regions with a species of oxygen, nitrogen, or another material. In some embodiments, the semiconductor structure 100 includes a second protection layer (not shown). The second protection layer is disposed between the source 126 and the dielectric layer 119 and between the drain 128 and the dielectric layer 119. In some embodiments, the second protection layer covers the source 126 and the drain 128 to reduce and/or prevent the source 126 and the drain 128 from exposure during an annealing process in the formation of the isolation regions.

FIG. 1B is a top-down view of the semiconductor structure 100 taken along line B-B of FIG. 1A, according to some embodiments. In some embodiments, the semiconductor structure 100 includes a plurality of coplanar waveguides 135. For example, the semiconductor structure 100 includes a second coplanar waveguide 136 in electrical communication with the gate 124, a third coplanar waveguide 138 in electrical communication with the source 126, and a fourth coplanar waveguide 140 in electrical communication with the drain 128. The second coplanar waveguide 136 includes a second primary conductor **136*a*, and a pair of second return conductors 136*b* and 136*c*. The third coplanar waveguide 138 includes a third primary conductor 138*a*, and a pair of third return conductors 138*b* and 138*c*. The fourth coplanar waveguide 140 includes a fourth primary conductor 140*a*, and a pair of fourth return conductors 140*b* and 140*c*. Other arrangements and/or configurations of the plurality of coplanar waveguides 135** are within the scope of the present disclosure.

In some embodiments, the primary conductors and/or one or both of the return conductors of the plurality of coplanar waveguides 135 are directly electrically connected to components and/or devices of the semiconductor structure 100 through fabrication of the metal layer 118. When directly electrically connected to components and/or devices of the semiconductor structure 100, such coplanar waveguides are active waveguides. In some embodiments, the primary conductors of the plurality of coplanar waveguides 135 may be directly electrically connected to components of the HEMT 120 when formed in the metal layer 118. For example, the gate 124 of the HEMT 120 may be electrically connected to the second primary conductor **136*a* to communicate an electrical signal, such as a microwave signal. In some embodiments, one or both of the return conductors of the plurality of coplanar waveguides 135 may be directly electrically connected to components of the HEMT 120 when formed in the metal layer 118. For example, the source 126 of the HEMT 120 may be coupled to ground through electrical connection to one of the pair of second return conductors 136*b* and 136*c*. In some embodiments, the primary conductors and the return conductors of the plurality of coplanar waveguides 135 are not directly electrically connected to components and/or devices of the semiconductor structure. When not directly electrically connected to components and/or devices of the semiconductor structure 100, such coplanar waveguides are passive waveguides. For example as illustrated in FIG. 1B, the coplanar waveguide 122 is not directly electrically connected to the HEMT 120 and is represented as a passive waveguide. In some embodiments, the HEMT 120 forms a two-dimensional electron gas (2DEG) in the second III-V compound layer 116 when responding to a microwave signal, and a conduction band edge $E_C$ of the p-type region 106 of the substrate 104 is above a Fermi level $E_F$ when the HEMT 120 is responding to the microwave signal to reduce coupling of the 2DEG with the substrate 104. Other configurations and/or couplings of the components and/or devices of the semiconductor structure 100 to the plurality of coplanar waveguides 135** are within the scope of the present disclosure.

In some embodiments, components of devices of the semiconductor structure, such as the HEMT 120, may be formed in different metal layers from the plurality of coplanar waveguides 135. For example, components of the HEMT 120 may be formed in a second metal layer (not shown) and connected to the plurality of coplanar waveguides 135 through inter-level contacts plugs, where illustrated dashed block lines represent electrical connections. As illustrated in FIG. 1B, the second primary conductor 136*a* may be electrically connected to the gate 124 through a first pair of inter-level contacts plugs 142*a*, 142*b*. The third primary conductor 138*a* may be electrically connected to the source 126 through a second pair of inter-level contacts plugs 144*a*, 144*b*. The fourth primary conductor 140*a* may be electrically connected to the drain 128 through a third pair of inter-level contacts plugs 146*a*, 146*b*. Other configurations and/or couplings of the HEMT 120 to the plurality of coplanar waveguides 135 are within the scope of the present disclosure.

In some embodiments, a plurality of metallization layers are embedded in a plurality of inter-layer dielectric (ILD) material, such as over a dielectric layer or an insulation layer. In some embodiments, the metallization layers and the inter-level contact plugs are comprised of metallic material such as copper, aluminum, or alloys thereof, using known techniques such as damascene, dual damascene, or subtractive metal etching. The plurality of metal layers may include, for example, five metal layers. In some embodiments, greater than or fewer than five metal layers may be provided in the semiconductor structure 100, depending on the application. Other arrangements and/or configurations of the plurality of coplanar waveguides 135 are within the scope of the present disclosure.

Figure 2:
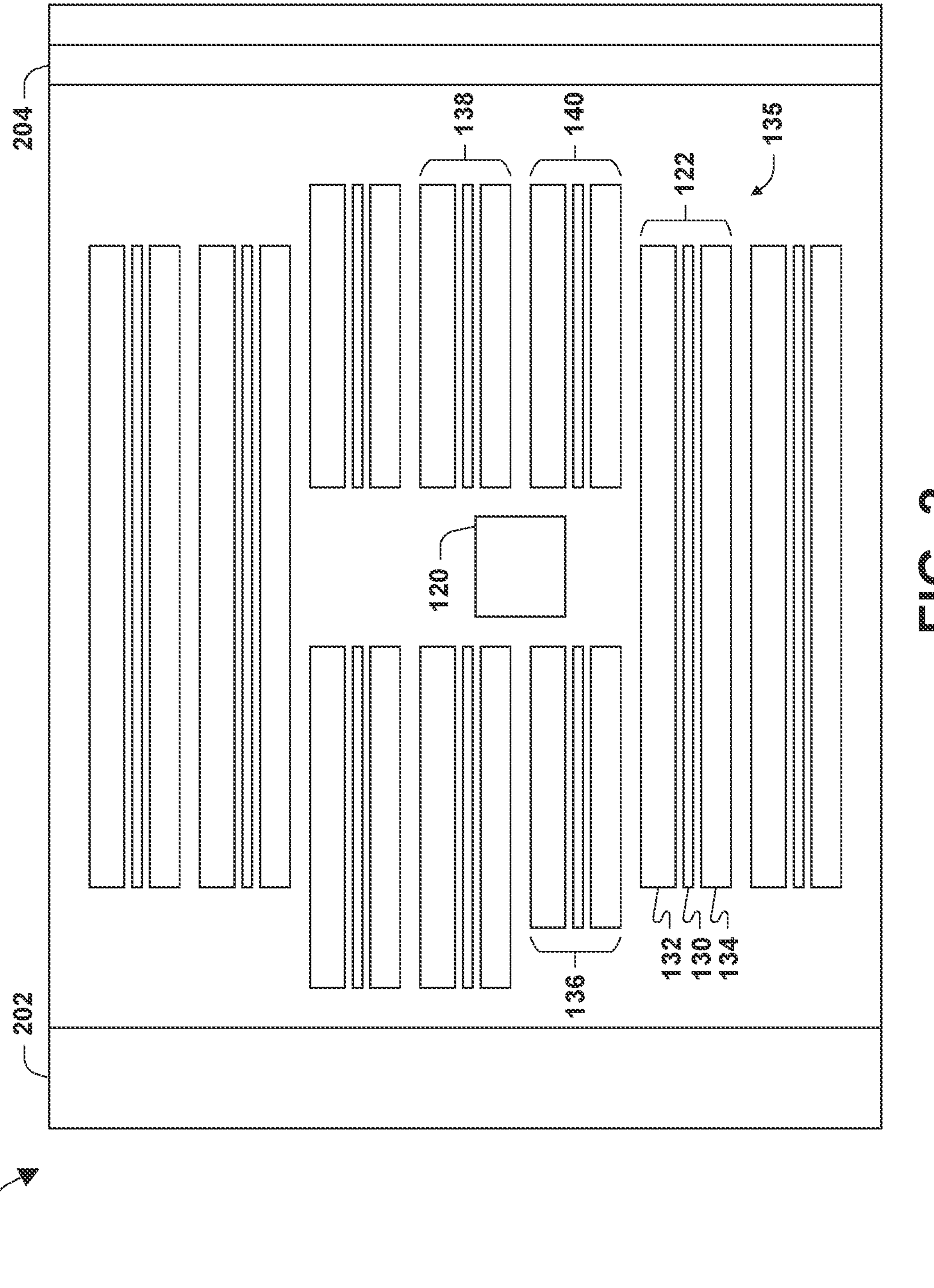
FIG. 2 illustrates a top down view of a semiconductor structure including a plurality of coplanar waveguides, according to some embodiments.

FIG. 2 illustrates a top down view of the semiconductor structure 100 including the plurality of coplanar waveguides 135, according to some embodiments. In some embodiments, the coplanar waveguide 122 functions to concentrate electromagnetic energy within a dielectric. In some embodiments, the dielectric may be adjacent, above, below, or surrounding the coplanar waveguide (e.g., the dielectric layer 119). In some embodiments, the dielectric comprises the substrate 104. In some embodiments, a dielectric layer is provided between the coplanar waveguide 122 and the second III-V compound layer 116. In some embodiments, the dielectric layer between the coplanar waveguide 122 and the second III-V compound layer 116 is greater than or equal to twice the width of the primary conductor 130. Such dimensions may reduce leakage of electromagnetic energy in the air surrounding the coplanar waveguide 122.

In some embodiments, the plurality of coplanar waveguides 135 are provided in a monitor pattern to monitor propagation loss of signals in the semiconductor structure 100. In some embodiments, the coplanar waveguide 122 supports quasi TEM mode at low frequencies and TE mode at high frequencies. The quasi TEM wave, at non-zero frequencies, may be provided because the E field and the H field have longitudinal components (i.e., hybrid mode). Such longitudinal components are usually small compared to other signal components. In some embodiments, the characteristic impedance of the coplanar waveguide 122 may vary based on the width of the primary conductor 130 and spaces separating the primary conductor 130 from the first return conductor 132 and the second return conductor 134. In some embodiments, the coplanar waveguide has a characteristic impedance between about 20 Ohm to 250 Ohm. In some embodiments, the electromagnetic wave carried by the coplanar waveguide 122 exists partly in the substrate 104, and partly in the air above it. In general, the dielectric constant of the substrate 104 will be different (e.g., greater) than that of the air, so that the wave is travelling in an inhomogeneous medium.

In some embodiments, one or more the plurality of coplanar waveguides 135 are integrated passive devices (IPD), such as the coplanar waveguide 122, where an active signal component for a device, such as the HEMT 120, is not communicated. In some embodiments, one or more the plurality of coplanar waveguides 135 are active devices, such as the second coplanar waveguide 136, the third coplanar waveguide 138, or the fourth coplanar waveguide 140. In some embodiments and when configured as an IPD, one or more of the primary conductor 130, the first return conductor 132, or the second return conductor 134 are connected to a ground plane, such as the ground plane 202. In some embodiments, a conductor of a coplanar waveguide, such as the third primary conductor 138*a*, is connected to a signal plane, such as the signal plane 204. In some embodiments, the coplanar waveguide 122 forms a GSG (ground/source/ground) structure, such that each ground to source distance is the same (e.g., a first distance between the primary conductor 130 and the first return conductor 132 is the same as a second distance between the primary conductor 130 and the second return conductor 134). Other arrangements and/or configurations of the plurality of coplanar waveguides 135 are within the scope of the present disclosure.

Figures 3A, 3B:
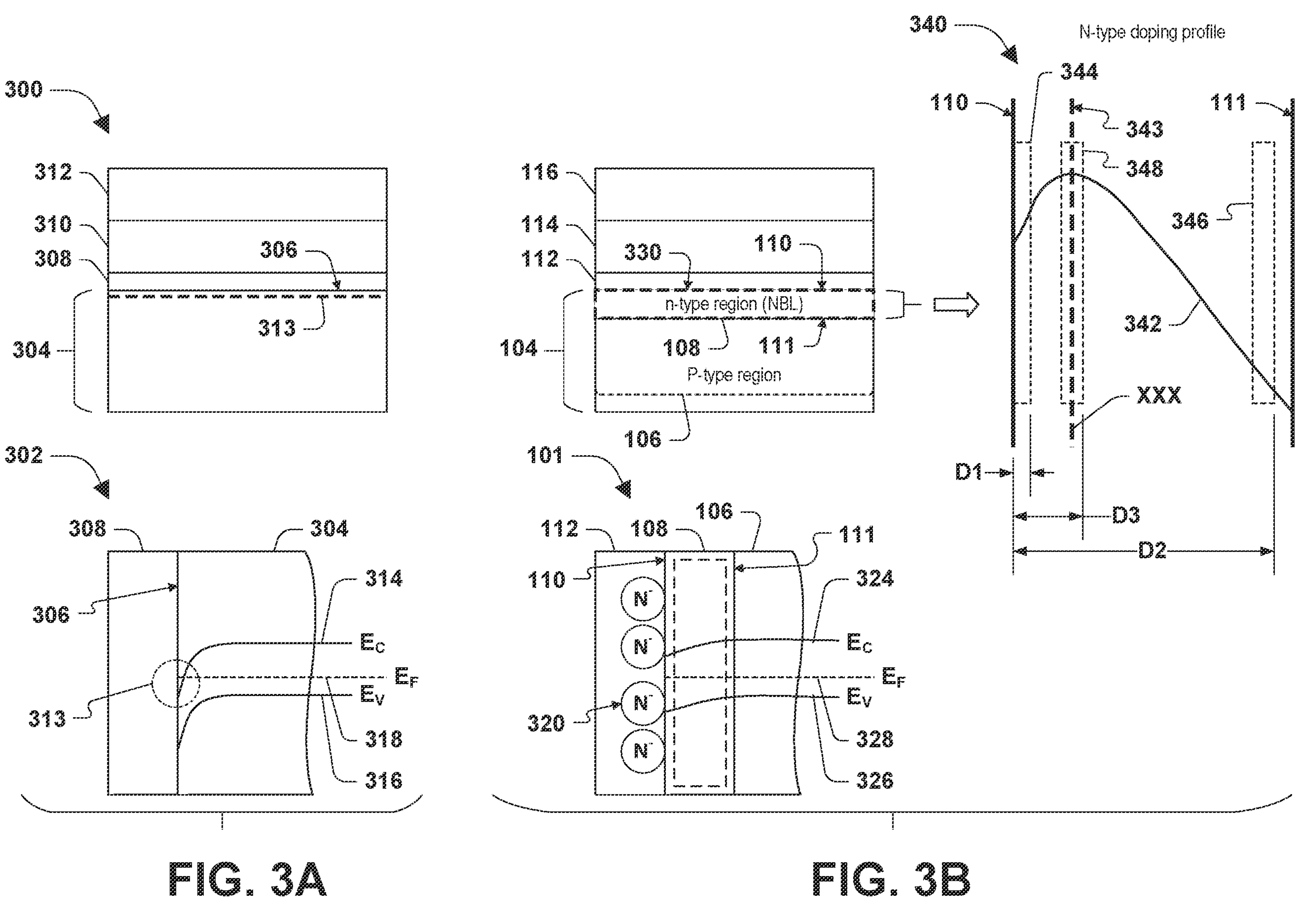
FIGS. 3A-3B illustrate semiconductor structures and band graphs, according to some embodiments.

FIGS. 3A-3B illustrate semiconductor structures and band graphs, according to some embodiments. FIG. 3A illustrates a semiconductor structure 300 and a band graph 302 without inclusion of the n-type region 108 of FIG. 1A. FIG. 3B illustrates the semiconductor structure 100 and a band graph 101 with inclusion of the n-type region 108, as illustrated in FIG. 1A. With reference to FIG. 3A, the semiconductor structure 300 includes a p-type region in a p-type substrate 304, a top surface 306 of the p-type substrate 304, a buffer layer 308, a first III-V compound layer 310, and a second III-V compound layer 312. An electron inversion layer 313 is formed into the p-type substrate 304 from the top surface 306. The band graph 302 illustrates changes in the band structure of electron energy levels from the buffer layer 308 and the p-type substrate 304. The vertical axis of the band graph 302 represents the energy of an electron, which includes both kinetic and potential energy.

The horizontal axis of the band graph 302 represents position, which is not drawn to scale. The Heisenberg uncertainty principle prevents the band graph 302 from being drawn with a high positional resolution because the energy bands are shown as resulting from a momentum-dependent band structure. In other words, as typical for band graphs, the top surface 306 provides an interface, which is depicted as a "black box" because the conduction band 314, the valence band 316, and the Fermi level 318 are represented as asymptotic band bending. The band graph 302 illustrates a conduction band 314 ($E_C$), a valence band 316 ($E_V$), and a Fermi level 318 ($E_F$). As illustrated in the band graph 302, the electron inversion layer 313 is formed in the p-type substrate 304 at the junction of the buffer layer 308 and the p-type substrate 304, such that the conduction band 314 crosses the Fermi level 318 close to the top surface 306. The electron inversion layer 313 provides for the formation of a secondary 2DEG, which may couple with a primary 2DEG induced in the GaN channel by a microwave signal during operation of the HEMT 120. As set forth in greater detail below and according to some embodiments, the n-type region 108, illustrated in FIG. 1A, provides a free electron inversion layer without formation of the electron inversion layer 313, thereby reducing parasitic losses and improving signal gain.

With reference to FIG. 3B, the semiconductor structure 100 includes the p-type region 106 in the substrate 104, the n-type region 108 in the p-type region 106, the top surface 110 of the substrate 104, the interface 111 between the n-type region 108 and the p-type region 106, the buffer layer 112, the first III-V compound layer 114, and the second III-V compound layer 116. The n-type region 108 comprises an n-type buried layer (NBL) within the p-type region 106. A band graph 101 illustrates changes in the band structure of electron energy levels from the buffer layer 112, the n-type region 108, and the p-type region 106. As schematically illustrated in the band graph 101, a plurality of donor electrons are provided at the top surface 110 of the substrate 104, which forms an interface between the buffer layer 112 and the substrate 104.

The band graph 101 illustrates a conduction band 324 ($E_C$), a valence band 326 ($E_V$), and a Fermi level 328 ($E_F$). As illustrated in the band graph 101, a free electron inversion layer 330 is formed in the n-type region 108, such that the conduction band 324 does not cross the Fermi level 328 in the p-type region 106 or the n-type region 108 (e.g., close to the top surface 110 of the substrate 104). The free electron inversion layer 330 reduces and/or eliminates the formation of a secondary 2DEG, which may couple with a primary 2DEG induced in the GaN channel by a microwave signal during operation of the HEMT 120. The n-type region 108 provides the free electron inversion layer 330 without formation of the electron inversion layer 313 (of FIG. 3A), thereby reducing parasitic losses and improving signal gain. In some embodiments, the semiconductor structure 100 includes the free electron inversion layer extending downward in the n-type region 108 from the top surface 110 of the substrate 104.

In some embodiments, the n-type region 108 comprises an n-type doping profile 340 where an n-type doping concentration 342 varies about the thickness of the n-type region 108. The vertical axis of the n-type doping profile 340 corresponds to a value of the n-type doping concentration and the horizontal axis corresponds to distance into the substrate 104 from the top surface 110 of the substrate 104. In some embodiments, the n-type doping concentration 342 forms a parabolic shape indicating, as illustrated at a vertex reference line 343, a higher doping concentration at the vertex of the parabolic shape. In some embodiments, the vertex reference line 343 is about 70 nm from the top surface 110 of the substrate 104. In some embodiments, a distance between the top surface 110 of the substrate 104 and the interface 111 between the n-type region 108 and the p-type region 106 is about 250 nm.

In some embodiments, the n-type region 108 includes a first n-type portion 344 having a first n-type dopant concentration, and a second n-type portion 346 having a second n-type dopant concentration less than the first n-type dopant concentration. In some embodiments, the first n-type portion 344 is between the buffer layer 112 and the second n-type portion 346. In some embodiments, the first n-type portion 344 is a first distance D1 from the top surface 110 of the substrate 104 and the second n-type portion 346 is a second distance D2 from the top surface 110 of the substrate 104, wherein the second distance D2 is greater than ten times the first distance D1. In some embodiments, the n-type region 108 includes a third n-type portion 348 having a third n-type dopant concentration different than the first n-type dopant concentration and different than the second n-type dopant concentration. In some embodiments, the doping concentration of the n-type region 108 is phosphorus, implanted with an energy of 50 keV, and having a median dose of about 3E15 ions/$cm^2$. In some embodiments, the n-type region 108 may comprise three layers with a second layer (e.g., a bottom-most layer) implanted with the second doping concentration at the second distance D2, a third layer (e.g., a middle layer) implanted with the second doping concentration at the second distance D2, and a first layer (e.g., a top-most layer) implanted with the first doping concentration at the first distance D1.

In some embodiments, the third n-type portion 348 is between the first n-type portion 344 and the second n-type portion 346. In some embodiments, the first n-type portion 344 is the first distance D1 from the top surface 110 of the substrate 104, the second n-type portion 346 is the second distance D2 from the top surface 110 of the substrate 104, the third n-type portion 348 is a third distance D3 from the top surface 110 of the substrate 104, the second distance D2 is greater than the first distance D1, and the second distance D2 is greater than two times the third distance D3. In some embodiments, the first distance D1 is between 0 and 10 nm from the top surface 110. In some embodiments, the second distance D2 is between 240 and 260 nm, such as about 250 nm. In some embodiments, the third distance D3 is between 60 and 80 nm, such as about 70 nm. Other arrangements and/or configurations of the n-type region 108 are within the scope of the present disclosure.

Figure 4B:
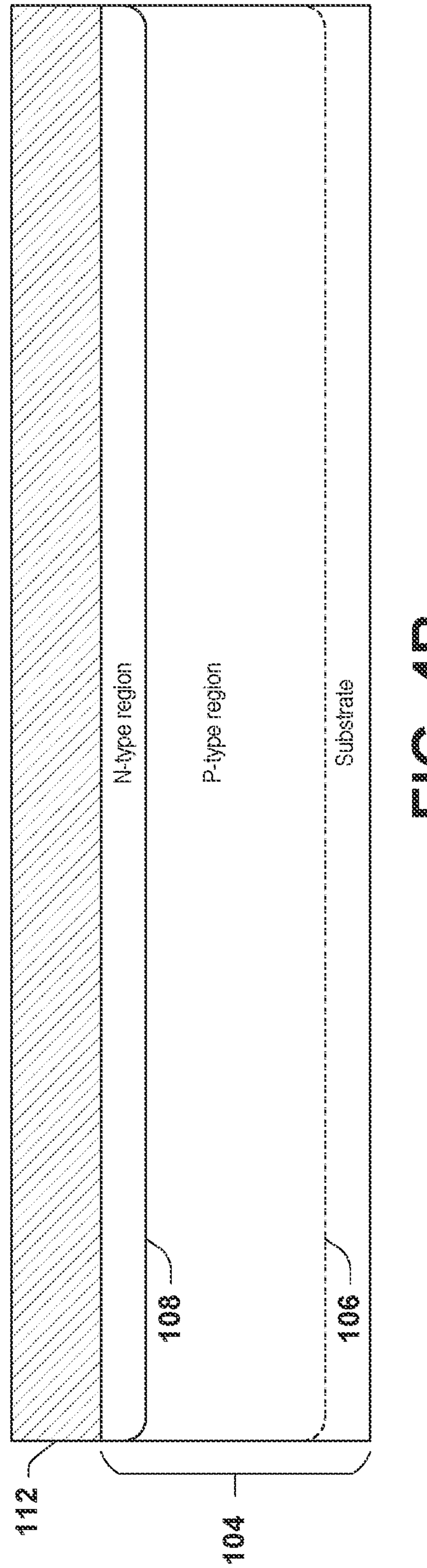

FIGS. 4A-4F illustrate a semiconductor structure 100 at various stages of fabrication, according to some embodiments. Referring to FIG. 4A, the substrate 104 is provided. The substrate 104 includes a silicon carbide (SiC) substrate, sapphire substrate or a silicon substrate. The substrate 104 comprises at least one of an epitaxial layer, a silicon-on-insulator (SOI) structure, a wafer, or a die formed from a wafer. For example, the epitaxial layer may comprise a deposition of an overlayer on a crystalline substrate, where the overlayer is in registry with the substrate 104. In some embodiments, the epitaxial layer may comprise a type of crystal growth or material deposition in which new crystalline layers are formed with one or more well-defined orientations with respect to a crystalline seed layer of the substrate 104. In some embodiments, the substrate 104 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. In some embodiments, the substrate 104 comprises at least one of monocrystalline silicon, crystalline silicon with a <100> crystallographic orientation, crystalline silicon with a <110> crystallographic orientation, crystalline silicon with a <111> crystallographic orientation or other suitable material.

In some embodiments, the semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor-supply layer. The substrate 104 is doped, as set forth herein, with a p-type dopant to form the p-type region 106. For example, the p-type dopant may comprise boron, $BF_2$, gallium, or other material that creates electron holes as majority charge carriers. In some embodiments, the p-type dopant is implanted into the substrate 104 such that the p-type region 106 and the substrate 104 are similar in composition before implantation of the n-type dopant. In some embodiments, the p-type dopant is implanted into a portion of the substrate 104 to form the p-type region 106. As illustrated in FIG. 4A, an n-type dopant is implanted into the p-type region 106 to form the n-type region 108. The n-type region 108 may be formed by implanting an n-type dopant 402 comprising an electron donor element. The n-type dopant 402 may comprise phosphorus, arsenic, or other material that creates electrons as majority charge carriers. For example, the n-type dopant 402 may comprise ion implantation of phosphorus with an energy of 10-200 keV, such as 50 keV, and an ion dose of 1E14-1E16 ions/$cm^2$, such as 1E15-5E15 ion/$cm^2$, or 3E15 ions/$cm^2$.

In some embodiments, a second substrate (not shown) is bonded with the substrate 104, such as by at least one of one or more bonding layers, an adhesive, a bonding process, or other suitable techniques. In some embodiments where the second substrate is bonded with the substrate 104 using the one or more bonding layers, the one or more bonding layers are between the second substrate and the substrate 104. The second substrate at least one of overlies the substrate, is in direct contact with the substrate 104, or is in indirect contact with the substrate 104. In some embodiments, one or more components of the semiconductor structure 100 are formed through an inversion operation. An inversion operation may be performed such that the semiconductor structure 100 lies beneath at least one of an interconnect structure or the second substrate during formation of one or more components, such as the metal structures 102 illustrated in FIG. 1A. For example, during formation of the interconnect structure, the top surface 110 of the substrate 104 corresponds to a back side the substrate 104, and a bottom surface 109 of the substrate 104 corresponds to a front side of the substrate 104. In some embodiments, a portion of the substrate 104 on the top surface 110 of the substrate 104 is removed, such as after the inversion operation, to reduce a thickness of the substrate 104.

As illustrated in FIG. 4B, the buffer layer 112 is formed on the substrate 104. In some embodiments, the buffer layer 112 acts as a buffer and/or a transition layer for the subsequently formed overlying layers. The buffer layer 112 may be epitaxially grown using metal-organic chemical vapor deposition (MOCVD). The buffer layer 112 may function as an interface to reduce lattice mismatch between substrate 104 and the subsequently formed III-V compound layers. In some embodiments, the buffer layer 112 includes an aluminum nitride (AlN) layer having a thickness in a range between about 10 nm to about 300 nm. The buffer layer 112 may include a single layer or a plurality of layers, as set forth in greater detail herein.

Figure 4C:
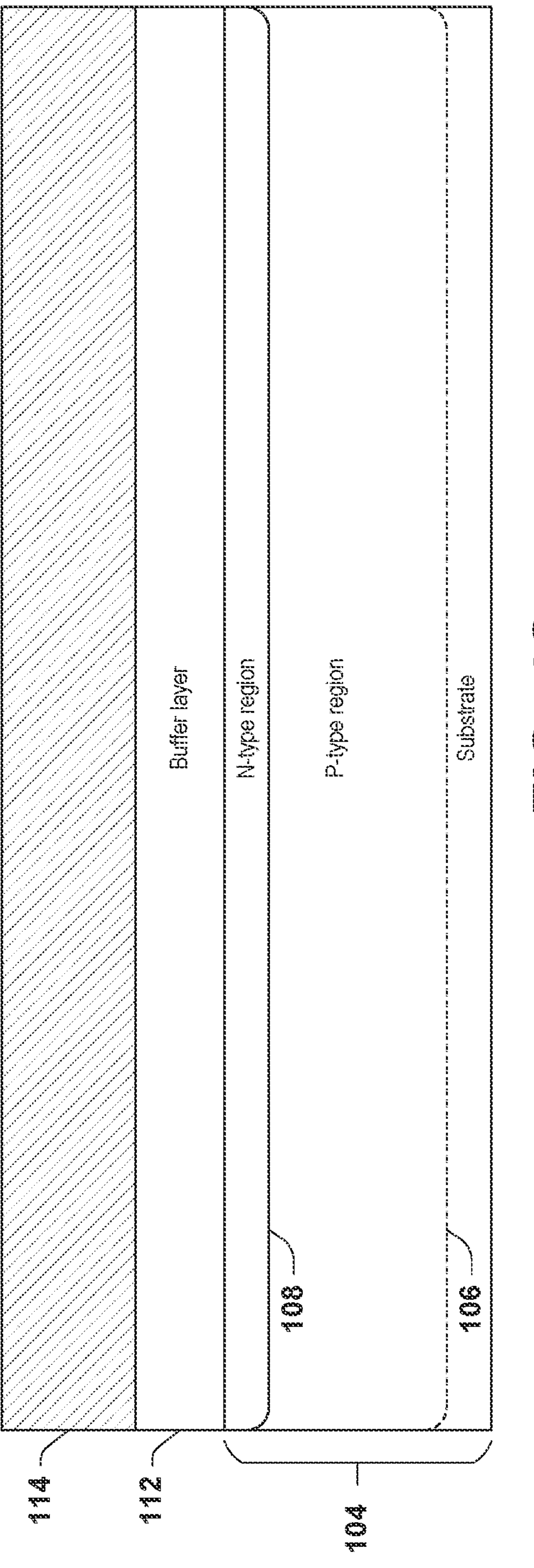

As illustrated in FIG. 4C, the first III-V compound layer 114 is formed on the buffer layer 112. The first III-V compound layer 114 is a compound made from the III-V groups in the periodic table of elements, as set forth in greater detail herein. In some embodiments, the first III-V compound layer 114 includes an aluminum gallium nitride (AlGaN) layer. In some embodiments, the first III-V compound layer 114 includes an AlGaAs layer or an AlInP layer. In some embodiments, the first III-V compound layer 114 may be epitaxially grown by using, for example, MOCVD, during which a gallium-containing precursor and a nitrogen-containing precursor are used, as set forth in greater detail herein. In some embodiments, the first III-V compound layer 114 is undoped. Alternatively, the first III-V compound layer 114 is unintentionally doped or may be, for example, lightly doped with n-type dopants due to a precursor used to form the first III-V compound layer 114. In some embodiments, the first III-V compound layer 114 has a thickness in a range from about 0.5 μm to about 10 μm.

Figure 4D:
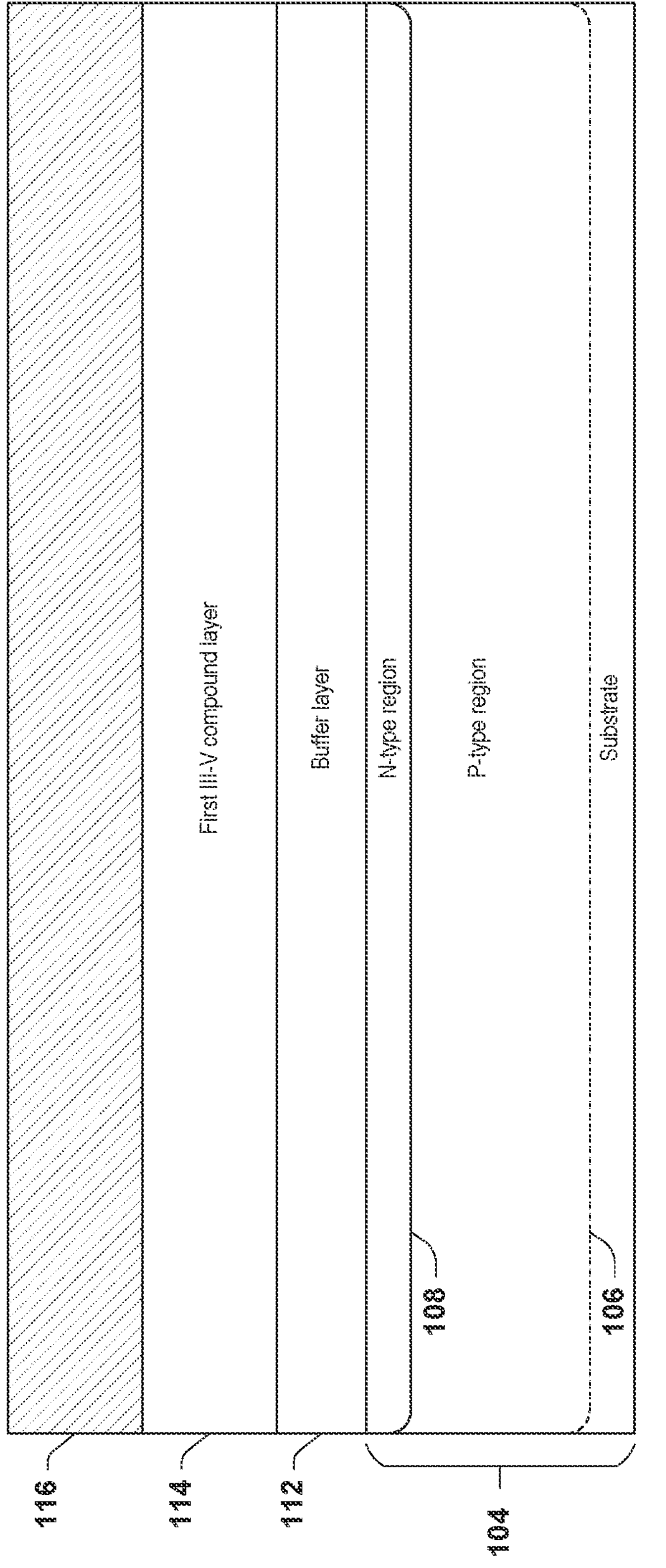

As illustrated in FIG. 4D, the second III-V compound layer 116 is formed on the first III-V compound layer 114. The second III-V compound layer 116 is a compound made from the III-V groups in the periodic table of elements, as set forth in greater detail herein. The second III-V compound layer 116 and the first III-V compound layer 114 are different from each other in composition. In some embodiments, the second III-V compound layer 116 includes a gallium nitride (GaN) layer. In some embodiments, the second III-V compound layer 116 includes a GaAs layer or an InP layer. In some embodiments, the second III-V compound layer 116 is undoped. In some embodiments, the second III-V compound layer 116 is epitaxially grown on the first III-V compound layer 114 by MOCVD using a gallium-containing precursor, and/or a nitrogen-containing precursor, as set forth in greater detail herein.

As illustrated in FIG. 4D, the metal layer 118 is formed on the second III-V compound layer 116. The metal layer 118 may be patterned to form the metal structure 102, as set forth in greater detail herein. In some embodiments, the metal structure, such as the HEMT 120 and/or the coplanar waveguide 122 are formed using sputtering, atomic layer deposition (ALD) or physical vapor deposition (PVD) operations. In some embodiments, the metal structure 102 and/or components of the metal structure 102 include at least one of Au, Al, Ti, Ni, or Cu. Other structures and/or configurations of the metal layer 118 are within the scope of the present disclosure.

Figure 4E:
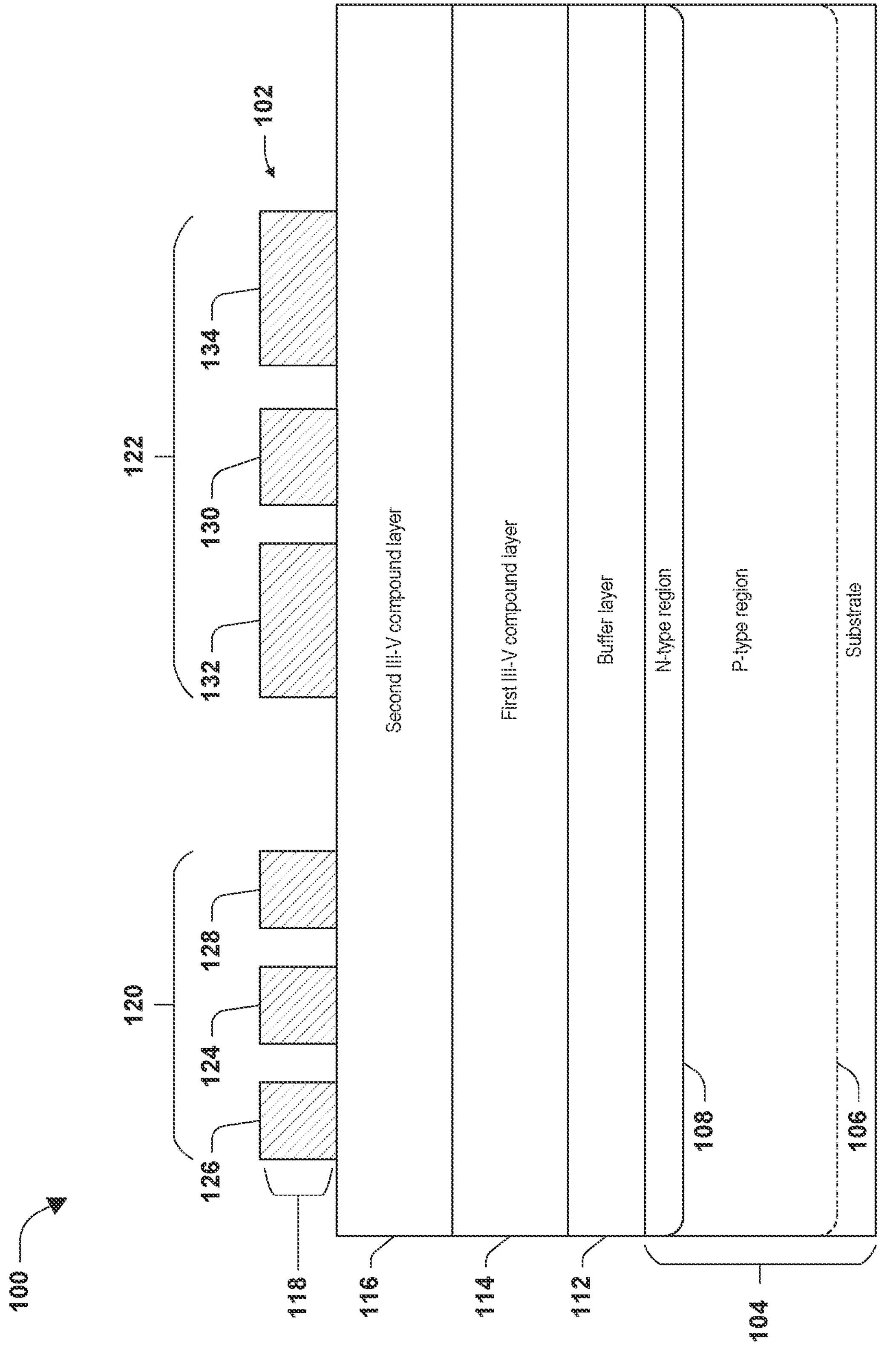
Figure 4F:
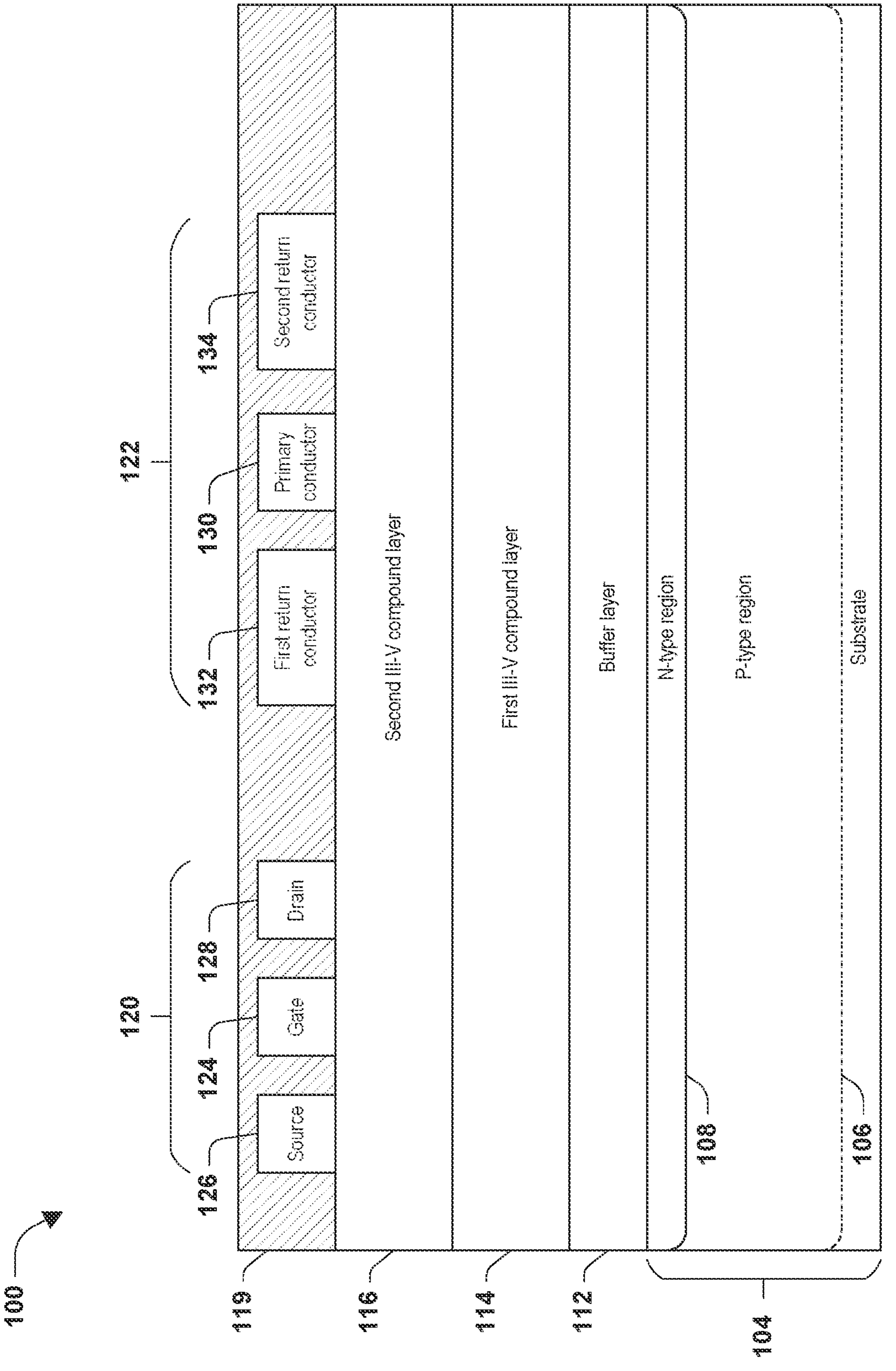

As illustrated in FIG. 4E, the dielectric layer 119 is formed over the metal layer 118 and the second III-V compound layer 116 to surround the metal structure 102 and/or components of the metal structure 102. The dielectric layer 119 is formed by at least one of PVD, sputtering, CVD, LPCVD, ALCVD, UHVCVD, RPCVD, ALD, MBE, LPE, spin on, growth, or other suitable techniques. In some embodiments, the dielectric layer 119 comprises a single layer. In some embodiments, the dielectric layer 119 comprises multiple layers, where an outer layer of the multiple layers may be configured with different adhesion properties than an inner layer. In some embodiments, the dielectric layer 119 is in direct contact with the metal layer 118 and/or the second III-V compound layer 116. In some embodiments, the dielectric layer 119 is in indirect contact with the metal layer 118 and/or and the second III-V compound layer 116. Other structures and/or configurations of the dielectric layer 119 are within the scope of the present disclosure.

In some embodiments, the semiconductor structure 100 comprises a buffer layer (not shown) between the metal layer 118 and/or the second III-V compound layer 116 and the dielectric layer 119, such as formed prior to forming the dielectric layer 119. In some embodiments, the buffer layer is in direct contact with the metal layer 118 and/or the second III-V compound layer 116, or is in indirect contact with the metal layer 118 and/or the second III-V compound layer 116.

The buffer layer comprises at least one of an anti-reflection coating, $SiO_2$, HfSiON, $HfSiO_x$, $HfAlO_x$, $HfO_2$, $ZrO_2$, $La_2O_3$, $Y_2O_3$, or other suitable material. The buffer layer is formed by at least one of PVD, sputtering, CVD, LPCVD, ALCVD, UHVCVD, RPCVD, ALD, MBE, LPE, spin on, growth, or other suitable techniques. In some embodiments, the buffer layer comprises a single layer that is configured to provide adhesion between the dielectric layer 119 and the metal layer 118 and/or the second III-V compound layer 116. According to some embodiments, the buffer layer comprises multiple layers, where an outer layer of the multiple layers is configured to provide adhesion with the dielectric layer 119. When the semiconductor structure 100 comprises the buffer layer, the dielectric layer 119 at least one of overlies the buffer layer, is in direct contact with a top surface of the buffer layer, or is in indirect contact with the top surface of the buffer layer. Other structures and/or configurations of the buffer layer are within the scope of the present disclosure.

The dielectric layer 119 comprises at least one of SiO, $SiO_2$, SiN, $Si_3N_4$, MgO, $Al_2O_3$, $Yb_2O_3$, ZnO, $Ta_2O_5$, $ZrO_2$, $HfO_2$, $TeO_2$, $TiO_2$, an oxide layer, or other suitable material. The dielectric layer 119 is formed by at least one of PVD, sputtering, CVD, LPCVD, ALCVD, UHVCVD, RPCVD, ALD, MBE, LPE, spin on, growth, or other suitable techniques. The dielectric layer 119 is formed over at least one of components of the metal structure 102, such as HEMT 120, the coplanar waveguide 122, or components thereof. In some embodiments, the dielectric layer 119 is formed over the top surface 110 of the substrate 104. Other arrangements and/or configurations for fabrication of the semiconductor structure 100 are within the scope of the present disclosure.

Figure 5:
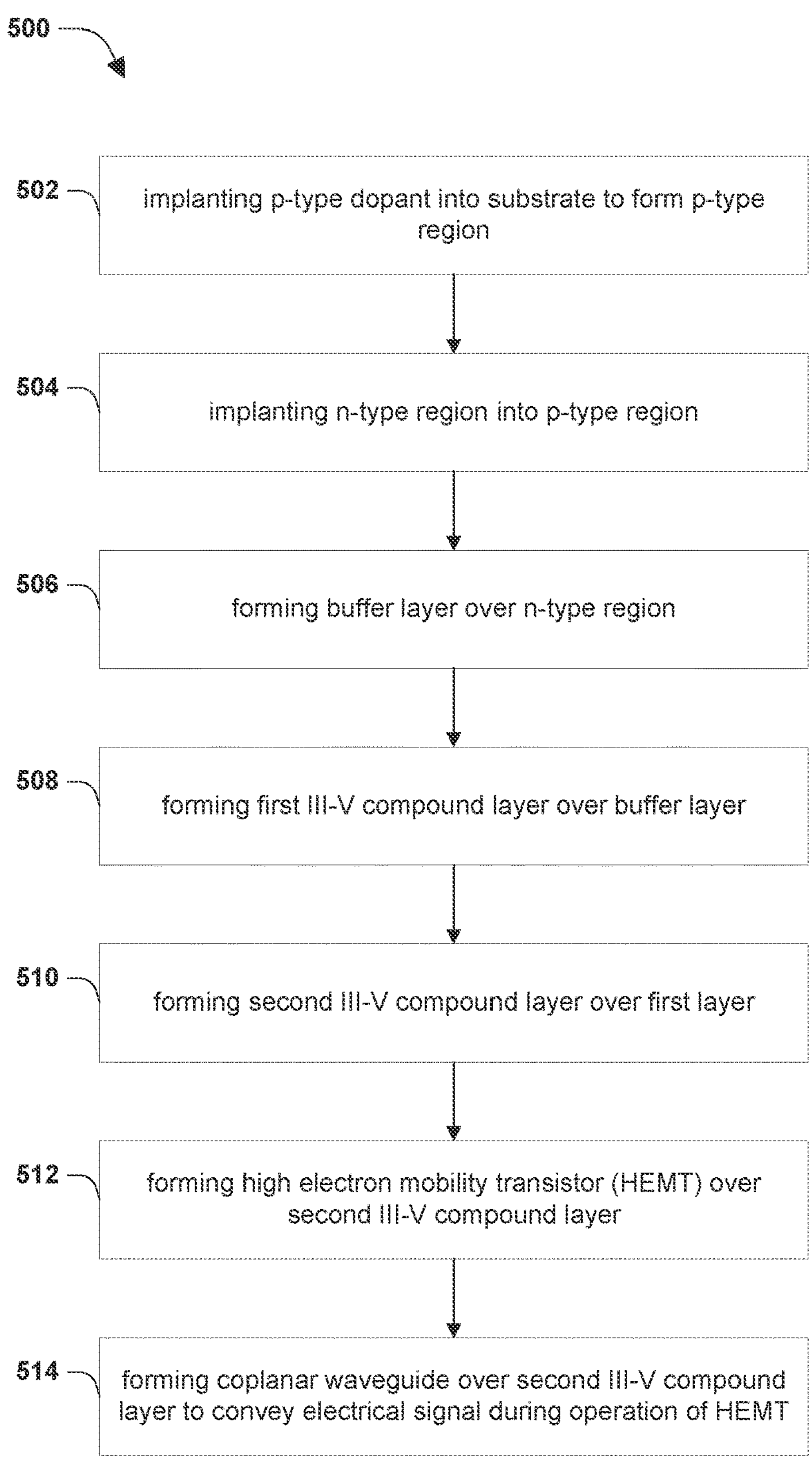
FIG. 5 illustrates a method of making a semiconductor device, according to some embodiments.

FIG. 5 illustrates a method 500 of making a semiconductor device, according to some embodiments. Some of the operations described can be replaced and/or eliminated for different embodiments. At 502, a p-type dopant is implanted into a substrate to form a p-type region. For example in FIG. 1A, a p-type dopant is implanted into the substrate 104 to form the p-type region 106.

At 504, an n-type region is implanted into the p-type region. For example, in FIG. 1A, the n-type region 108 is implanted into the p-type region 106.

At 506, a buffer layer is formed over the n-type region. For example, in FIG. 1A, the buffer layer 112 is formed over the n-type region 108.

At 508, a first III-V compound layer is formed over the buffer layer. For example, in FIG. 1A, the first III-V compound layer 114 is formed over the buffer layer 112.

At 510, a second III-V compound layer is formed over the first III-V compound layer. For example, in FIG. 1A, the second III-V compound layer 116 is formed over the first III-V compound layer 114.

At 512, a high electron mobility transistor (HEMT) is formed over the second III-V compound layer. For example, in FIG. 1A, the HEMT 120 is formed over the second III-V compound layer 116.

At 514, a coplanar waveguide is formed over the second III-V compound layer to convey an electrical signal during operation of the HEMT. For example, in FIG. 1A, the coplanar waveguide 122 is formed over the second III-V compound layer 116 to convey an electrical signal during operation of the HEMT 120. Other and/or additional operations of making a semiconductor device are within the scope of the present disclosure.

In some embodiments, a semiconductor structure is provided. The semiconductor structure includes a substrate including a p-type region and an n-type region, wherein the n-type region is in the p-type region and a distance between a top surface of the substrate and the n-type region is less than a distance between the top surface of the substrate and the p-type region. A buffer layer is over the n-type region and a first III-V compound layer is over the buffer layer. A second III-V compound layer is over the first III-V compound layer and a metal structure is over the second III-V compound layer.

In some embodiments, a semiconductor device is provided. The semiconductor device includes a substrate including a p-type region and an n-type region in the p-type region. The n-type region includes a first n-type portion having a first n-type dopant concentration and a second n-type portion having a second n-type dopant concentration less than the first n-type dopant concentration. The semiconductor device includes a buffer layer over the n-type region, a first III-V compound layer over the buffer layer, and a second III-V compound layer over the first III-V compound layer. A high electron mobility transistor (HEMT) is over the second III-V compound layer and a coplanar waveguide is over the second III-V compound layer to convey an electrical signal during operation of the HEMT.

In some embodiments, a method of manufacturing a semiconductor device is provided. The method includes implanting a p-type dopant into a substrate to form a p-type region and implanting an n-type region into the p-type region. The method includes forming a buffer layer over the n-type region, forming a first III-V compound layer over the buffer layer, and forming a second III-V compound layer over the first III-V compound layer. The method includes forming a high electron mobility transistor (HEMT) over the second III-V compound layer and forming a coplanar waveguide over the second III-V compound layer to convey an electrical signal during operation of the HEMT.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor structure, comprising:

a substrate including a p-type region and an n-type region, wherein:

the n-type region is in the p-type region, a distance between a top surface of the substrate and the n-type region is less than a distance between the top surface of the substrate and the p-type region, a maximum dopant concentration of the n-type region is closer to the top surface of the substrate than a bottom surface of the n-type region interfacing with the p-type region, the maximum dopant concentration is below a top surface of the n-type region, the n-type region comprises:

a first n-type portion having a first n-type dopant concentration;

a second n-type portion having a second n-type dopant concentration less than the first n-type dopant concentration; and a third n-type portion having a third n-type dopant concentration different than the first n-type dopant concentration and different than the second n-type dopant concentration, the third n-type portion is between the first n-type portion and the second n-type portion, the first n-type portion is a first distance from the top surface of the substrate, the second n-type portion is a second distance from the top surface of the substrate, the third n-type portion is a third distance from the top surface of the substrate, the third n-type dopant concentration is the maximum dopant concentration of the n-type region, the second distance is greater than the first distance, and the second distance is greater than two times the third distance;

a buffer layer over the n-type region;

a first III-V compound layer over the buffer layer;

a second III-V compound layer over the first III-V compound layer; and a metal structure over the second III-V compound layer, wherein the top surface of the substrate faces the metal structure.

2. The semiconductor structure of claim 1, wherein the buffer layer comprises AlN.

3. The semiconductor structure of claim 1, wherein the first III-V compound layer comprises at least one of AlGaN, AlGaAs, or AlInP.

4. The semiconductor structure of claim 1, wherein the second III-V compound layer comprises at least one of GaN, GaAs, or InP.

5. The semiconductor structure of claim 1, comprising a free electron inversion layer extending downward in the n-type region from the top surface of the substrate.

6. The semiconductor structure of claim 1, wherein the first n-type portion is between the buffer layer and the second n-type portion.

7. The semiconductor structure of claim 1, wherein the second distance is greater than ten times the first distance.

8. The semiconductor structure of claim 1, wherein the metal structure comprises a coplanar waveguide, the coplanar waveguide comprising:

a primary conductor extending linearly over the second III-V compound layer;

a first return conductor extending linearly over the second III-V compound layer and coplanar with the primary conductor; and a second return conductor extending linearly over the second III-V compound layer and coplanar with the primary conductor.

9. The semiconductor structure of claim 1, wherein the metal structure comprises a high electron mobility transistor (HEMT), the HEMT comprising:

a gate extending linearly over the second III-V compound layer;

a source extending linearly over the second III-V compound layer and coplanar with the gate; and a drain extending linearly over the second III-V compound layer and coplanar with the gate.

10. A semiconductor device, comprising:

a substrate including a p-type region;

an n-type region in the p-type region, comprising:

a first n-type portion having a first n-type dopant concentration at a top surface of the substrate;

a second n-type portion below the first n-type portion and having a second n-type dopant concentration, wherein the second n-type dopant concentration is greater than the first n-type dopant concentration and the second n-type dopant concentration is a maximum n-type dopant concentration in the n-type region; and a third n-type portion having a third n-type dopant concentration less than the first n-type dopant concentration at an interface of the p-type region and the n-type region;

a buffer layer over the n-type region;

a first III-V compound layer over the buffer layer;

a second III-V compound layer over the first III-V compound layer;

a high electron mobility transistor (HEMT) over the second III-V compound layer, wherein the top surface of the substrate faces the HEMT; and a coplanar waveguide over the second III-V compound layer to convey an electrical signal during operation of the HEMT.

11. The semiconductor device of claim 10, comprising:

a second buffer layer between the buffer layer and the n-type region, wherein:

the buffer layer comprises AlN, and the second buffer layer comprises SiN to limit diffusion of Al into the n-type region during formation of the buffer layer.

12. The semiconductor device of claim 10, wherein:

the HEMT forms a two-dimensional electron gas (2DEG) in the second III-V compound layer when responding to a microwave signal; and a conduction band edge ($E_C$) of the p-type region of the substrate is above a fermi level ($E_F$) when the HEMT is responding to the microwave signal to reduce coupling of the 2DEG with the substrate.

13. The semiconductor device of claim 10, wherein the second n-type portion is closer to the first n-type portion than to the third n-type portion.

14. The semiconductor device of claim 10, wherein a distance between the top surface of the substrate and the third n-type portion is at least two times a distance between the top surface of the substrate and the second n-type portion.

15. A semiconductor structure, comprising:

a substrate comprising a p-type region;

a free electron inversion layer in the substrate over the p-type region, wherein:

the free electron inversion layer is an n-type region having a dopant concentration that continually increases from a top surface of the substrate to a first depth within the n-type region, and then continually decreases from the first depth to a bottom surface of the n-type region interfacing with the p-type region, and a maximum value of the dopant concentration is closer to the top surface of the substrate than to the bottom surface of the n-type region interfacing with the p-type region;

a buffer layer over the free electron inversion layer;

a first III-V compound layer over the buffer layer;

a second III-V compound layer over the first III-V compound layer; and a metal structure over the second III-V compound layer.

16. The semiconductor structure of claim 15, wherein the buffer layer is a nitride layer.

17. The semiconductor structure of claim 15, comprising a dielectric layer over the metal structure and contacting the second III-V compound layer.

18. The semiconductor structure of claim 15, wherein the metal structure comprises a coplanar waveguide.

19. The semiconductor structure of claim 18, wherein the coplanar waveguide comprises:

a primary conductor over the second III-V compound layer;

a first return conductor over the second III-V compound layer; and a second return conductor over the second III-V compound layer.

20. The semiconductor structure of claim 15, wherein the metal structure comprises a high electron mobility transistor (HEMT).

* * * * *